US008075954B2

(12) United States Patent
Nagata et al.

(10) Patent No.: US 8,075,954 B2
(45) Date of Patent: Dec. 13, 2011

(54) COATING METHOD AND APPARATUS, A PERMANENT MAGNET, AND MANUFACTURING METHOD THEREOF

(75) Inventors: Hiroshi Nagata, Kanagawa (JP); Yoshinori Shingaki, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 12/710,949

(22) Filed: Feb. 23, 2010

(65) Prior Publication Data

US 2010/0159129 A1 Jun. 24, 2010

Related U.S. Application Data

(62) Division of application No. 11/886,629, filed as application No. PCT/JP2006/305034 on Mar. 14, 2006.

(30) Foreign Application Priority Data

Mar. 18, 2005 (JP) ................................ 2005-080021

(51) Int. Cl.
*C23C 16/00* (2006.01)
*B05D 5/12* (2006.01)
(52) U.S. Cl. ...................... 427/250; 427/248.1; 427/127
(58) Field of Classification Search .................. 427/250, 427/248.1, 127
See application file for complete search history.

(56) References Cited

U.S. PATENT DOCUMENTS

| 5,147,447 A | 9/1992 | Takeshita et al. | |
|---|---|---|---|
| 2006/0278517 A1* | 12/2006 | Machida et al. | 204/192.1 |
| 2007/0034299 A1* | 2/2007 | Machida et al. | 148/105 |

FOREIGN PATENT DOCUMENTS

| JP | 62-074048 A | 4/1987 |
| JP | 62-267469 A | 11/1987 |
| JP | 2004-296973 A | 10/2004 |

OTHER PUBLICATIONS

Office Action from Chinese Patent App. No. 1006800087263 (Feb. 27, 2009).
Park, K. T., "Improvement of coercive on thin Nd2Fe14B sintered permanent magnets," A doctor's thesis of Touhoku University, Mar. 23, 2000.
Suzuki, S., et al., "Nd-Fe-B kei Bisho Jishaku no Hyomen Kaishitsu ni yoru Kotokuseika," Dai 27 Kai The Magnetics Society of Japan Gakujutsu Koen Gaiyoshu, 2003, p. 386.

* cited by examiner

*Primary Examiner* — Kelly M Gambetta
(74) *Attorney, Agent, or Firm* — Cermak Nakajima LLP; Tomoko Nakajima

(57) ABSTRACT

The object of the present invention is to improve the productivity of a permanent magnet and to manufacture it at a low cost by effectively coating Dy and Tb on a surface of the magnet of Fe—B-rare earth elements having a predetermined configuration. The permanent magnet of the present invention is manufactured by a coating step for coating Dy on the surface of the magnet of Fe—B-rare earth elements having a predetermined configuration and a diffusing step for diffusing Dy coated on the surface of the magnet into crystal grain boundary phases of the magnet with being heat treated at a predetermined temperature. In this case, the coating step comprises a first step for heating a process chamber used for carrying out the coating step and generating metallic vapor atmosphere within the process chamber by vaporizing vaporizable metallic material previously arranged within the process chamber, and a second step for introducing into the process chamber the magnet held at a temperature lower than that within the process chamber and then selectively depositing the vaporizable metallic material on a surface of the magnet by an effect of temperature difference between the temperature within the process chamber and that of the magnet by the magnet reaches a predetermined temperature.

8 Claims, 10 Drawing Sheets

FIG.5

| | Pretreatment | Vapor deposition | Heat treatment | Hcj[kOe] | Br[kG] | (BH)max [MGOe] |
|---|---|---|---|---|---|---|
| Comparative example 1 | No | No | No | 11.2 | 14.5 | 49.5 |
| Comparative example 2 | Yes | No | No | 10.8 | 14.5 | 49.2 |
| Comparative example 3 | No | No | Yes | 11 | 14.5 | 49.1 |
| Embodiment 4 | No | Yes | Yes | 18.2 | 14.3 | 49.5 |
| Embodiment 2 | Yes | Yes | No | 16.5 | 14.3 | 49.1 |
| Embodiment 3 | No | Yes | Yes | 21.2 | 14.4 | 49.2 |
| Embodiment 1 | Yes | Yes | Yes | 23.5 | 14.4 | 50.3 |

FIG.6

| Temperature T[°C] | Dy coating thickness after one minute coating[μm] | Hcj[kOe] | Br[kG] | (BH)max[MGOe] |
|---|---|---|---|---|
| 742 | 0 | 11.2 | 14.5 | 50.1 |
| 812 | 0 | 11.3 | 14.3 | 49.5 |
| 897 | 0 | 12.5 | 14.2 | 49.1 |
| 997 | 1 | 12.8 | 14.3 | 49.2 |
| 1122 | 35 | 17.9 | 14.4 | 50.3 |
| 1272 | 126 | 21.2 | 14.3 | 48.9 |
| 1457 | 155 | 21.1 | 14.3 | 49.7 |
| 1712 | 189 | 20.9 | 14.2 | 48.5 |

FIG.7

| Holding time duration[s] | Dy costing thickness [μm] | Max. temp. of sintered magnet[°C] | Hcj[kOe] | Br[kG] | (BH)max [MGOe] |
|---|---|---|---|---|---|
| 10 | 17 | 143 | 15.4 | 14.1 | 48.9 |
| 20 | 43 | 263 | 20.3 | 14.1 | 49.1 |
| 30 | 66 | 383 | 21.3 | 14.1 | 48.3 |
| 40 | 97 | 503 | 21.3 | 14.3 | 49.9 |
| 50 | 115 | 623 | 21.0 | 14.4 | 49.0 |
| 60 | 138 | 743 | 20.9 | 14.3 | 48.8 |

FIG.8

| Hcj[kOe] | Br[kG] | (BH)max[MGOe] |
|---|---|---|
| 21.3 | 14.4 | 50.0 |

(a)

| | Dy coating thickness [μm] | | | | | | | | | | | | | | |
|---|---|---|---|---|---|---|---|---|---|---|---|---|---|---|---|
| | Length direction | | | | | | | | | Height direction | | | Breadth direction | | |
| Holding time duration [s] | (1) | (2) | (3) | (4) | (5) | (6) | (7) | (8) | (9) | (10) | (11) | (12) | (13) | (14) | (15) |
| 10 | 20 | 21 | 25 | 20 | 20 | 16 | 20 | 25 | 18 | 18 | 16 | 19 | 21 | 23 | 20 |
| 20 | 45 | 36 | 44 | 38 | 45 | 42 | 39 | 37 | 37 | 42 | 37 | 41 | 45 | 41 | 43 |
| 30 | 65 | 66 | 62 | 68 | 66 | 68 | 64 | 65 | 63 | 59 | 66 | 60 | 66 | 67 | 62 |
| 40 | 94 | 99 | 103 | 101 | 104 | 103 | 98 | 101 | 98 | 98 | 99 | 94 | 104 | 100 | 96 |
| 50 | 120 | 126 | 112 | 115 | 115 | 125 | 116 | 117 | 115 | 113 | 114 | 116 | 127 | 115 | 119 |
| 60 | 142 | 132 | 137 | 139 | 145 | 139 | 141 | 142 | 133 | 139 | 140 | 137 | 137 | 146 | 136 |

| Max. temp. of magnet | | 100 | 150 | 200 | 250 | 300 | 350 | 400 | 450 | 500 | 550 | 600 | 650 | 700 | 750 | 800 | 850 | 900 | 950 | 1000 | 1050 |
|---|---|---|---|---|---|---|---|---|---|---|---|---|---|---|---|---|---|---|---|---|---|
| Percent defective of Dy coating peeling | non-vapor deposition | 0 | 0 | 0 | 1 | 2 | 10 | 3 | 0.5 | 0 | 0 | 0 | 0 | 0 | 0 | 0 | 0 | 0 | 0 | 0 | 0 |
| Dy coating thickness | | 10 | 12 | 14 | 15 | 16 | 16 | 16 | 18 | 20 | 22 | 23 | 24 | 24 | 26 | 28 | 30 | 32 | 35 | 38 | 40 |
| Br(kG) | 13.7 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 | 13.8 |
| (BH)max(MGOe) | 44 | 45 | 45 | 45 | 45 | 45 | 45 | 45 | 45 | 45 | 45 | 45 | 45 | 45 | 45 | 45 | 45 | 45 | 45 | 45 | 45 |
| Hcj(kOe) | 15 | 28 | 30 | 30 | 30 | 30 | 30 | 30 | 30 | 30 | 30 | 30 | 30 | 30 | 30 | 30 | 30 | 31 | 31 | 32 | 32 |

FIG.11

|  | Surface treatment | Thickness of surface layer ($\mu$m) | Magnetic properties ||| Corrosion/weather resistance |||
|---|---|---|---|---|---|---|---|---|
|  |  |  | Br(kG) | (BH)max (MGOe) | Hcj(kOe) | 100hr. test of saline solution spray | 100hr. test of PCT | 100hr. test of moisture resistance |
| Embodiment 7 | Dy vapor deposition + heat treatment | 20 | 15.0 | 56.0 | 28.0 | OK | OK | OK |
| Comparative example 1 | Resin costing | 20 | 14.5 | 49.2 | 8.3 | OK | NG | NG |
| Comparative example 2 | Ni plating | 20 | 14.2 | 48.1 | 7.2 | NG | NG | OK |
| Comparative example 3 | Aluminum vapor deposition | 20 | 14.4 | 48.9 | 8.9 | NG | NG | OK |
| Comparative example 4 | None | 0 | 14.6 | 49.8 | 8.6 | NG | NG | NG |

FIG.12

|  | Coating thickness | Hcj | Br | (BH)max |
|---|---|---|---|---|
| Dy | 30 | 23.5 | 14.3 | 50.3 |
| Dy+Nd | 30 | 28.2 | 14.4 | 50.9 |
| Dy+Pr | 30 | 28.5 | 14.4 | 51.0 |
| Dy+Al | 30 | 24.4 | 14.3 | 50.5 |
| Dy+Cu | 30 | 24.1 | 14.2 | 50.1 |
| Dy+Ga | 30 | 26.7 | 14.3 | 50.2 |
| Dy+Ta | 30 | 24.1 | 14 | 50.0 |
| Dy+Ni | 30 | 17.5 | 14.2 | 47.1 |
| Dy+Co | 30 | 19.5 | 14.8 | 49.9 |
| Dy+Fe | 30 | 18.1 | 14.3 | 47.2 |
| Dy+Au | 30 | 17.5 | 14.1 | 46.3 |
| Dy+Pt | 30 | 17.6 | 14.2 | 45.5 |
| Dy+Ag | 30 | 17.8 | 14.3 | 44.1 |

# COATING METHOD AND APPARATUS, A PERMANENT MAGNET, AND MANUFACTURING METHOD THEREOF

This application is a divisional under 35 U.S.C. §120 of U.S. patent application Ser. No. 11/886,629, filed on Sep. 18, 2007, which was a U.S. national phase patent application under 35 U.S.C. §371 of PCT Patent Application No. PCT/JP2006/305034, filed on Mar. 14, 2006, which claims priority under 35 U.S.C. §119 to Japanese Patent Application No. 2005-080021, filed on Mar. 18, 2005, all of which are incorporated in their entireties by reference.

BACKGROUND OF THE INVENTION

1. Field of the Invention

The present invention relates to coating method and apparatus, a permanent magnet, and a manufacturing method thereof, and more particularly to a permanent magnet and a manufacturing method thereof in which the permanent magnet is manufactured by coating vaporizable metallic material including at least one of Dy and Tb on a surface of a magnet of Fe—B-rare earth elements, and then diffusing at least one of Dy and Tb into crystal grain boundary phases of a sintered magnet by heat treating the vaporizable metallic material at a predetermined temperature, as well as to coating method and apparatus suitable for coating vaporizable metallic material including at least one of Dy and Tb on the surface of the magnet.

2. Description of Background Art

A sintered magnet of Nd—Fe—B (a so-called "neodymium magnet") has been used in various products e.g. motors for a hybrid vehicle and generators etc. recently since the neodymium magnet can be made of combination of elements Fe, Nd and B which are cheap and sufficiently and stably obtainable resources and also has high magnetic properties (its maximum energy product is 10 times that of ferritic magnet). On the other hand the sintered magnet of Nd—Fe—B has a problem that it is demagnetized by heat when it is heated beyond its predetermined temperature since its Curie temperature is low such as 300° C.

Accordingly when manufacturing the sintered magnet of Nd—Fe—B, since Dy and Tb have the magnetic anisotropy of 4 f-electron larger than that of Nd and have the negative Stevens factor similarly to that of Nd, it can be appreciated to add Dy or Tb to remarkably improve the magnetocrystalline anisotropy of the principal phase. However, since Dy and Tb take the ferrimagnetism structure in which Dy and Tb take a spin orientation opposite to that of Nd in the principal phase crystal lattice, it is caused a problem that the magnetic field strength, therefore the maximum energy product exhibiting the magnetic properties is greatly reduced.

For solving such a problem, it is proposed to firstly coat Dy or Tb on a whole surface of a sintered magnet of Nd—Fe—B having a predetermined configuration such as a rectangular parallelopiped at a predetermined coating thickness (thickness more than 3 μm determined based on a volume of the magnet) and then to uniformly diffusing Dy and Tb coated on the surface of the magnet into the crystal grain boundary phases of the magnet with carrying out heat treatment at a predetermined temperature (see non-patent document 1 mentioned below).

The permanent magnet manufactured according to this method has merits in that the coercive force generating mechanism of nucleation-type is reinforced by an effect that Dy and Tb diffused in the crystal grain boundary phases increase the magnetocrystalline anisotropy in each crystal grain surface and by the result of which the coercive force is remarkably improved almost without causing loss of the maximum energy product (for example, the non-patent document 1 discloses that it is possible to have a magnet having the coercive force of 23 KOe (3 MA/m) at the remanent magnetic flux density of 14.5 kG (1.45 T) and the maximum energy product of 50 MGOe (400 Kj/m$^3$). When coating Dy or Tb on the surface of the sintered magnet of Nd—Fe—B, it can be appreciated to use the sputtering method that exhibits an excellent adhesion of Dy or Tb coating to a surface of sintered magnet.

Note: non-patent document 1; "Improvement of coercive on thin Nd2Fe14B sintered permanent magnets" (Park Ki Te, A doctor's thesis of Touhoku University, Mar. 23, 2000).

DISCLOSURE OF THE INVENTION

Problems to be Solved by the Invention

However since the sputtering method is bad in usage efficiency of its target and in yield of vaporizable metallic material for coating, it is not suit for coating of Dy or Tb which is scarce material and thus cannot be expected to sufficiently and stably supply. In addition in order to coat a whole surface of a magnet having a predetermined configuration such as a rectangular parallelopiped by using the sputtering method, it is necessary to rotate the magnet itself and thus it is required to provide a mechanism for rotating the magnet. This further increases manufacturing cost of the magnet in addition to a cost for making a sputtering target of Dy or Tb which is rare resources and expensive.

SUMMARY OF THE INVENTION

It is, therefore, a first object of the present invention to provide a permanent magnet and a manufacturing method thereof which can manufacture the magnet at a low cost with effectively using Dy and Tb as coating material and coating them on a surface of the magnet of Fe—B-rare earth elements having a predetermined configuration.

It is also a second object of the present invention to provide a coating method and a coating apparatus which can exhibit high yield of vaporizable metallic material to be coated and achieve a substantially uniform coating at a high speed over a whole surface of an article to be coated (i.e. a sintered magnet) having a predetermined configuration and which is suit in particularly to coating of Dy and Tb on a surface of a magnet of Fe—B-rare earth elements having a predetermined configuration.

Means for Achieving the Objects

For achieving the object of the present invention, there is provided, according to the present inventiona, a coating method comprising a first step for heating a process chamber and generating metallic vapor atmosphere within the process chamber by vaporizing vaporizable metallic material previously arranged within the process chamber, and a second step for introducing into the process chamber articles to be coated held at a temperature lower than that within the process chamber and then selectively depositing the vaporizable metallic material on a surface of article to be coated by an effect of temperature difference between the temperature within the process chamber and that of the articles to be coated.

According to this coating method of the present invention, since the metallic coating is formed by selectively depositing the vaporizable metallic material on a surface of article to be coated by an effect of temperature difference between the temperature within the process chamber and that of the articles to be coated, it is possible to achieve high yield of the vaporizable metallic material to be coated and to coat a whole surface of article to be coated having a predetermined configuration at a high speed.

In such a case, it is preferable that the metallic vapor atmosphere is in a saturated condition within the process chamber so as to have the coating at a higher speed.

Also according to the present invention, there is provided a coating apparatus comprising a process chamber which can heat substantially uniformly an inside of the process chamber to a high temperature by a heating means, a preparatory chamber communicating to the process chamber, an evacuating means for holding both the process and preparatory chambers at a predetermined degree of vacuum, an open/close means moveable between an opened position in which the process and preparatory chambers are communicated each other and a closed position in which the process chamber is tightly closed, and a conveying means which can move the articles to be coated between the process chamber and the preparatory chamber and can tightly close the process chamber when the article to be coated are moved into the process chamber at the opened position of the open/close means, wherein the process chamber is heated at the closed position of the open/close means, metallic vapor atmosphere is generated by vaporizing vaporizable metal material previously arranged within the process chamber, the articles to be coated within the preparatory chamber are moved into the process chamber by the conveying means with the open/close means being moved to the opened position so as to selectively deposit the vaporizable metallic material on a surface of article to be coated by an effect of temperature difference between the temperature within the process chamber and that of the articles to be coated.

In this coating apparatus, both the process chamber and the preparatory chamber are evacuated to a predetermined degree of vacuum via the evacuating means after the articles to be coated have been arranged within the preparatory chamber. Then when the process chamber is heated after the open/close means has been moved to the closed position to tightly close the process chamber, the metallic vapor atmosphere is generated within the process chamber with the vaporizable metallic material previously arranged within the process chamber being vaporized. Then the open/close means is moved to the opened position and the articles to be coated are moved from the preparatory chamber to the process chamber by the conveying means. When articles to be coated held at a temperature lower than that within the process chamber (e.g. articles of ordinary temperature) are introduced into the process chamber, metallic atoms in the metallic vapor atmosphere are selectively deposited only on the surface of article to be coated at a high speed. Thus, it is possible to achieve high yield of the vaporizable metallic material to be coated and to coat a whole surface of article to be coated having a predetermined configuration at a high speed.

In such a case, it is preferable that the process chamber is arranged within a vacuum chamber equipped with another evacuating means and defined by a uniformly heating plate formed with an opening at one side thereof, a heat insulating member is arranged so that it encloses the uniformly heating plate except for said side of the uniformly heating plate in which said opening is formed, and a heating means for heating the uniformly heating plate is arranged between the uniformly heating plate and the heat insulating member. Such a structure makes it possible to substantially uniformly heat the process chamber by heating the uniformly heating plate with the use of the heating means and by indirectly heating the process chamber via the uniformly heating plate.

Also it is preferable that the coating apparatus further comprises a gas introducing means for introducing inert gas into the preparatory chamber, and the inert gas is introduced into the preparatory chamber via the gas introducing means so as to hold the pressure within the process chamber at a negative pressure relative to that of the preparatory chamber. Such a structure makes it possible to prevent the vaporizable metallic material from flowing into the preparatory chamber by a pressure difference between the process chamber and the preparatory chamber when the open/close means is moved to the opened position in order to introduce the articles to be coated into the process chamber after the metallic vapor atmosphere has been generated within the process chamber.

On the other hand, it is preferable that the preparatory chamber is equipped with a gas introducing means for introducing He gas into the preparatory chamber, and the He gas is introduced into the preparatory chamber via the gas introducing means so as to hold the pressure within the process chamber at substantially same as that within the preparatory chamber. Such a structure makes it possible to prevent the vaporizable metallic material from flowing into the preparatory chamber by a difference in specific gravity between the process chamber and the preparatory chamber when the open/close means is moved to the opened position in order to introduce the articles to be coated into the process chamber after the metallic vapor atmosphere has been generated within the process chamber.

In such a case, it is preferable that the process chamber is arranged below the preparatory chamber.

It is also preferable that the coating apparatus further comprises a placement means on which the vaporizable metallic material can be placed within the process chamber, and the placement means is formed as an annulus so that the vaporizable metallic material can be arranged around the articles to be coated when the articles to be coated are moved into the process chamber by the conveying means. This makes it possible to uniformly heat the vaporizable metallic material at any portion of the placement means and thus to obtain a further uniform coating.

In addition, it is preferable that the preparatory chamber is equipped with a plasma generating means for cleaning the surface of article to be coated by using plasma.

On the other hand, it is also preferable that the preparatory chamber is equipped with another heating means for cleaning the surface of article to be coated by heat treatment with introducing the inert gas into the vacuum atmosphere or the preparatory chamber via the gas introducing means connected thereto.

It is preferable that the vaporizable metallic material is alloy including either one of Dy or Tb or including at least one of Dy and Tb, and the article to be coated is a sintered magnet of Fe—B-rare earth elements having a predetermined configuration.

Further according to the present invention there is provided a method for manufacturing a permanent magnet comprising steps for coating vaporizable metallic material including at least one of Dy and Tb on a surface of a magnet of Fe—B-rare earth elements having a predetermined configuration, and diffusing the vaporizable metallic material coated on the surface of the magnet into crystal grain boundary phases of a sintered magnet by heat treating the vaporizable metallic material at a predetermined temperature characterized in that the coating step comprises a first step for heating a process chamber used for carrying out the coating step and generating metallic vapor atmosphere within the process chamber by vaporizing vaporizable metallic material previously arranged within the process chamber, and a second step for introducing into the process chamber the magnet held at a temperature lower than that within the process chamber and then selectively depositing the vaporizable metallic material on a surface of the magnet by an effect of temperature difference between the temperature within the process chamber and that of the magnet by the magnet reaches a predetermined temperature.

According this manufacturing method, the metallic vapor atmosphere is generated by heating the process chamber after the vaporizable metallic material including at least one of Dy and Tb of the coating material has been arranged within the process chamber. Then, when articles to be coated held at a temperature lower than that within the process chamber (e.g. articles of ordinary temperature) are introduced into the process chamber heated to a high temperature, metallic atoms including Dy and Tb in the metallic vapor atmosphere are selectively deposited only on the surface of article to be coated at a high speed. Then the vaporization is stopped after having held the magnet in this condition for a predetermined time duration until the magnet reaches a predetermined temperature. Accordingly vaporizable metallic material including at least one of Dy and Tb can be coated at a high speed on the surface of the magnet at a predetermined coating thickness and thus the productivity of the magnet can be improved. In addition since the vaporizable metallic material including at least one of Dy and Tb is selectively deposited only on the surface of article to be coated, it is possible to effectively use Dy and Tb which are rare resources and expensive and thus to reduce the manufacturing cost of magnet.

It is preferable the metallic vapor atmosphere is in a saturated condition within the process chamber in order to coat at a higher speed the vaporizable metallic material including at least one of Dy and Tb on the surface of magnet. Although it is possible to contain within the process chamber inert gases in addition to vapors of the vaporizable metallic materials including at least one of Dy and Tb, coating at a maximum speed can be attained when the total pressure within the process chamber is filled with saturated vapors of vaporizable metallic materials including at least one of Dy and Tb.

The melting point of Dy and Tb is high and thus it is preferable that the vaporizable metallic material further includes at least one of Nd, Pr, Al, Cu, Ga and Ta in order to generating the metallic vapor atmosphere within the process chamber in a short time. This enables to further increase the coercive force as compared with a permanent magnet made by heat treatment for example after coating of Dy only.

By the way, when the magnet of ordinary temperature is introduced into the process chamber heated to a high temperature, the magnet itself is also heated by the radiant heat. Then when this magnet is heated and thermally expanded, peeling of the coating deposited on the surface of magnet is liable to be caused by a fact that the thermal expansion exhibits abnormality like as inver alloy at a temperature below the Curie point. Thus Accordingly, it is preferable that the predetermined temperature in the second step is lower than 250° C. or higher than 450° C. This is because that the peeling of the coating deposited on the surface of magnet is hard to be caused since strain due to thermal expanding abnormality is reduced at a temperature lower than 250° C. and on the other hand, adhesion between the magnet and at least one of Dy and Tb deposited on the surface of magnet is improved due to melting of part of the magnet and thus the peeling of the coating deposited on the surface of magnet is hard to be caused at a temperature higher than 450° C.

In this case, it is preferable that the method for manufacturing a permanent magnet further comprises a step for cleaning the surface of the magnet within the vacuum atmosphere prior to introduction into the process chamber of the magnet held at a temperature lower than that within the process chamber. This makes it possible to remove for example oxide film on the surface of magnet and thus to increase the adhesive strength of the vaporizable metallic material including one of Dy and Tb to the surface of magnet as well as to uniformly diffuse Dy and Tb coated on the surface of magnet into crystal grain boundary phase of the magnet during diffusing step.

It is also preferable that the temperature within the process chamber in the first step is set at a range of 1,000~1,700° C. This is because that a vapor pressure which can coat the vaporizable metallic material including at least one of Dy and Tb at a high speed on the surface of magnet cannot be obtained at a temperature lower than 1,000° C. and on the other hand the coating time duration of the magnet becomes too short to obtain a uniform coating at a temperature higher than 1,700° C.

It is also preferable that the grain diameter of the vaporizable metallic material arranged within the process chamber in the coating step is in a range of 10~1,000 μm. This is because that handling of grains of Dy and Tb having inflammability is difficult at a grain diameter smaller than 10 μm and on the other hand the surface area of the grains is reduced and thus a longer time duration for vaporization is required at a grain diameter larger than 1,000 μm.

Further according to the present invention, there is provided a permanent magnet comprising a magnet of Fe—B-rare earth elements having a predetermined configuration, and a surface of the magnet being selectively deposited by the vaporizable metallic material by an effect of temperature difference between the temperature within the process chamber and that of the magnet by the magnet reaches a predetermined temperature with generating metallic vapor atmosphere within the process chamber by vaporizing vaporizable metallic material including at least one of Dy and Tb and with introducing into the processing chamber the magnet held at a temperature lower than that within the process chamber, then the magnet being heat treated so as to diffusing at least one of Dy and Tb on the surface of the magnet into crystal grain boundary phases of the magnet.

The neodymium magnet of the prior art has nature of being easily corroded and thus its surface is covered by a protecting film such as resin coating or nickel plating. On the contrary, the surface of the magnet of the present invention is covered by a coating including at least one of Dy and Tb having extremely high corrosion and weather resistance. Thus at least one of Dy and Tb plays a role of the protecting film of the magnet and thus it is possible to obtain a permanent magnet having excellent corrosion and weather resistance without requiring any additional protecting film. Accordingly it is possible to further improve the productivity and to reduce the manufacturing cost.

In this case, it is preferable that the surface and crystal grain boundary of the magnet have a rich phase including at least one of Dy and Tb. According to this structure, it is possible to have a permanent magnet having extremely excellent corrosion and weather resistance due to the presence of the rich phase including at least one of Dy and Tb in addition to the presence of the rich phase on the surface of magnet.

It is further preferable that the surface of the magnet is covered by the rich phase, and the crystal grain boundary includes 1~50% rich phase. If the crystal grain boundary includes the rich phase exceeding 50%, the maximum energy product, the remanent magnetic flux density and the coercive force exhibiting the magnetic properties are extremely reduced.

Effects of the Invention

The permanent magnet and its manufacturing method of the present invention have effects that the magnet can be manufactured at a high productivity and a low cost with effectively using Dy and Tb of coating materials and coating them at a high speed on the surface of magnet of Fe—B-rare earth elements having a predetermined configuration and that the magnet has excellent corrosion resistance and weather resistance without any additional protective film.

In addition, the coating method and apparatus of the present invention have effects that they can carry out coating of vaporizable metallic material at high yield and speed and substantially uniformly on a whole surface of the magnet having a predetermined configuration and are especially suitable for coating of vaporizable metallic material including Dy and Tb on a surface of magnet of Fe—B-rare earth elements having a predetermined configuration.

BRIEF DESCRIPTION OF THE DRAWINGS

Additional advantages and features of the present invention will become apparent from the subsequent description and the appended claims, taken in conjunction with the accompanying drawings, wherein:

FIG. 5 is a table showing average values of magnetic properties of permanent magnets manufactured in an embodiment 1;

FIG. 6 is a table showing average values of coating thickness coated in an embodiment 2 and magnetic properties of permanent magnets manufactured in the embodiment 2;

FIG. 7 is a table showing average values of coating thickness and maximum temperature of Dy coated in an embodiment 3 and magnetic properties of permanent magnets manufactured in an embodiment 3;

FIG. 8 is a table showing average values of magnetic properties of a permanent magnet manufactured in an embodiment 4;

FIG. 10 is a table showing magnetic properties and the percent defective of adhesion of coating of a permanent magnet obtained in an embodiment 6;

FIG. 11 is a table showing the magnetic property, the corrosion resistance and the weather resistance respectively of an embodiment 7 and comparative examples 1~4; and FIG. 12 is a table showing magnetic properties of a permanent magnet manufactured in an embodiment 8.

DESCRIPTION OF THE PREFERRED EMBODIMENTS

Best Mode for Carrying Out the Invention

Figure 1:
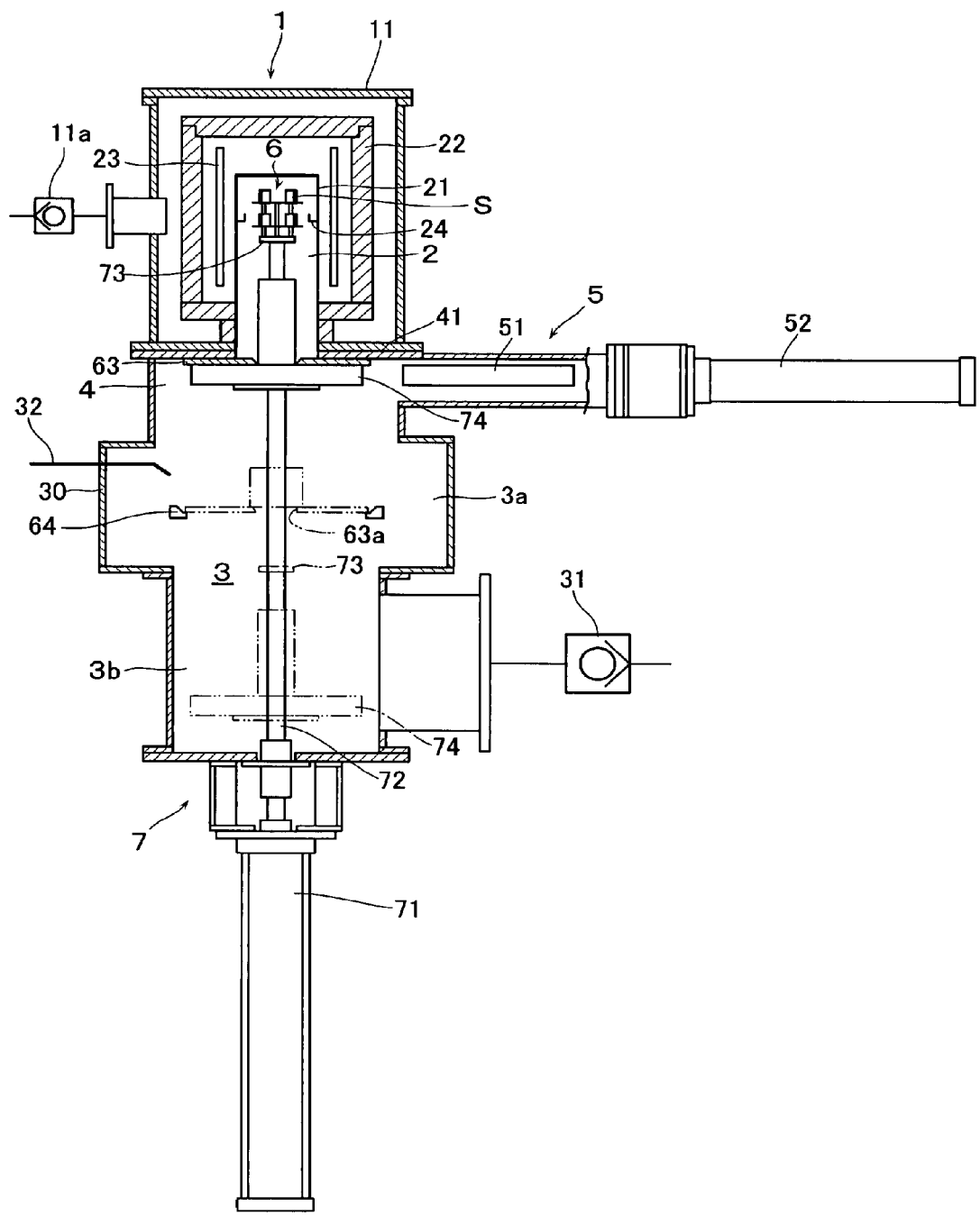
FIG. 1 is an explanatory schematic view showing a structure of the coating apparatus of the present invention.
Figure 2:
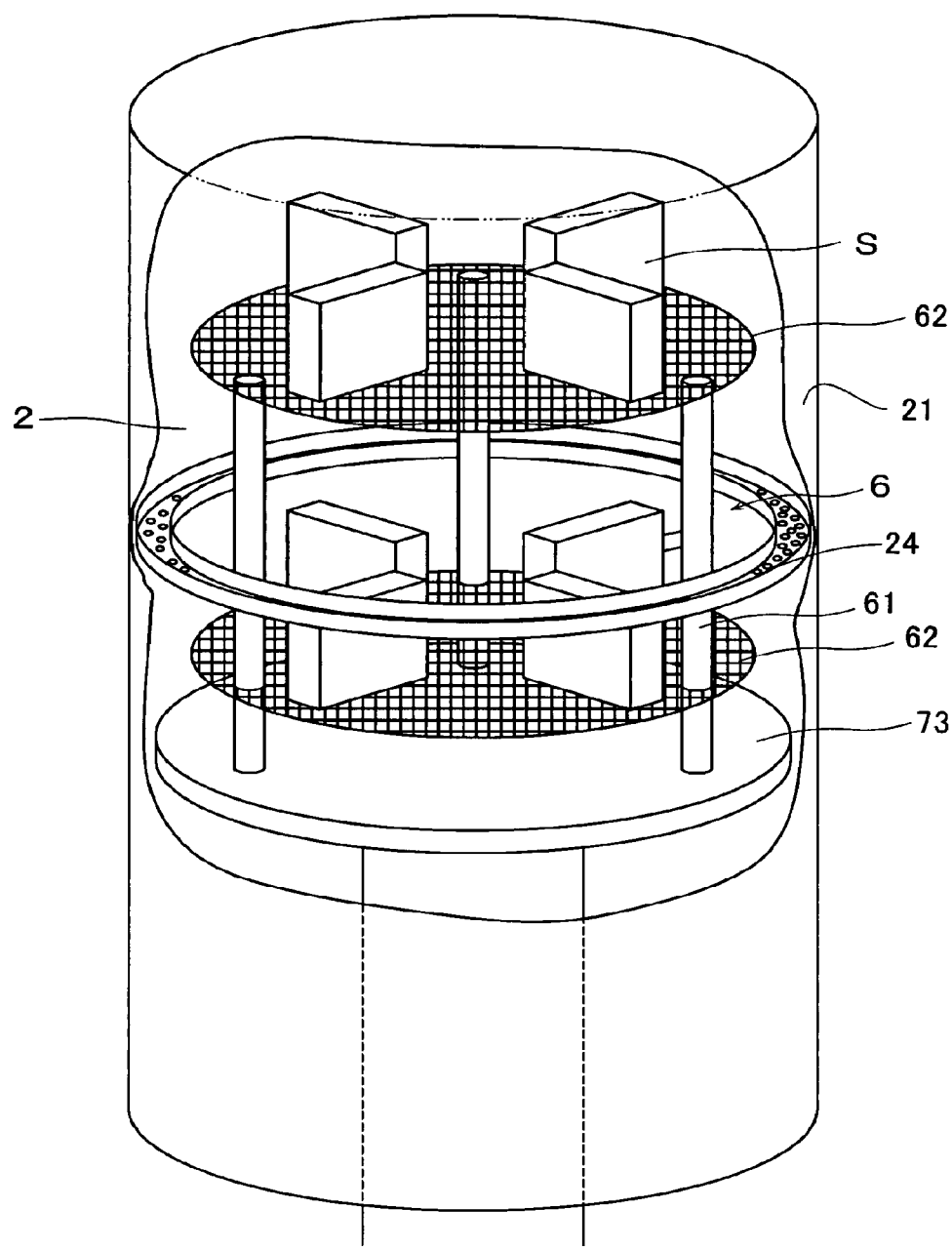
FIG. 2 is an explanatory view showing a support means for supporting sintered magnets i.e. articles to be coated within a process chamber.

With reference to FIGS. 1 and 2, a numeral 1 denotes a coating apparatus suitable for selectively coating vaporizable metallic materials such as Dy and Tb at a high speed on the surface of article S, e.g. sintered magnet of Fe—B-rare earth elements. The coating apparatus 1 has a process chamber 2 and a preparatory chamber 3 connected vertically each other. The process chamber 2 positioned above the preparatory chamber 3 is arranged within a cylindrical vacuum chamber 11 which can be held in a predetermined degree of vacuum through an evacuating means 11a such as a turbo-molecular pump, a cryopump, a diffusion pump etc.

The process chamber 2 is defined by a uniformly heating plate 21 having a cylindrical configuration opened at its bottom end communicating with the preparatory chamber 3. The uniformly heating plate 21 is surrounded except for its opened bottom by a heat insulating member 22 of carbon arranged within the vacuum chamber 11. For example, a plurality of electric heaters 23 consisting of W forming a heating means are arranged between the uniformly heating plate 21 and the heat insulating member 22. Thus a space within the process chamber 2 can be heated substantially uniformly by heating the uniformly heating plate 21 surrounded by the heat insulating member 22 with use of the heating means 23 within vacuum and thus by indirectly heating the space within the process chamber 2 via the uniformly heating plate 21.

As most clearly shown in FIG. 2, an acceptor 24 having a "U" shaped cross-section is arranged within the process chamber 2. The acceptor 24 is used for placing the vaporizable metallic material thereon and thus forms a placement means. The acceptor 24 is mounted on the inner surface of the uniformly heating plate 21 and has an annular configuration so that the vaporizable metallic material conveyed into the process chamber 2 by a conveyor mentioned below can be arranged around the articles to be coated S. The vaporizable metallic material is selected according to the coating to be coated on the surface of article to be coated and the vaporizable metallic material of pellet configuration is uniformly arranged on the acceptor 24 therealong. The acceptor 24 is not necessary to be formed as a continuous annulus and may be separately formed at equidistant in a circumferential direction.

A first space 4 is formed under the process chamber 2 and an open/close means 5 is arranged within the first space 4. The open/close means 5 comprises a valve body 51 and a driving means 52 such as a pneumatic cylinder and can be displaced by the driving means 52 between an opened position (FIG. 1) in which the process chamber 2 and the preparatory chamber 3 are communicated with each other via the valve body 51 and a closed position in which the process chamber 2 is tightly closed with the valve body 51 being contacted with a top plate 41 forming the first space 4 and sealing an opening formed in the top plate 41. The valve body 51 is provided with a second heating means (not shown).

A second space 3a is arranged under the first space 4. A side wall 30 defining the second space 3a is provided with a gate valve (not shown) through which articles S to be coated are introduced into the preparatory chamber 3 and taken out therefrom. The articles S to be coated are supported on a supporting means 6. The supporting means 6 comprises three posts 61 and two supporting members 62 arranged respectively spaced from the bottom of the posts 61 at a predetermined distance and supported by the posts 61. Each post 61 has a small diameter so as to minimize heat transmission therethrough. This is because to minimize heat transmission from a pusher member 74 mentioned below to articles S i.e. sintered magnets via the posts 61.

Each supporting member 62 is formed as a net of wires of 0.1~10 mmφ so that a bottom surface of the articles S placed on the supporting member 62 can be coated. The distance between the supporting members 62 is set in view of the height of the articles S placed thereon. The supporting means 6 is arranged within the second space 3a and mounted on a disc 63 formed with a central opening 63a through which a supporting table mentioned below can pass. The disc 63 is adapted to be placed on a supporting ring 64 arranged within the process chamber 2.

A third space 3b is formed under the second space 3a and these second and third spaces 3a and 3b define the preparatory chamber 3. A evacuating means 31 such as a turbo-molecular pump, a cryopump and a diffusion pump etc. is connected to the preparatory chamber 3. Thus the preparatory chamber 3 and process chamber 2 communicated with the preparatory chamber 3 via the first space 4 are held at a predetermined degree of vacuum by the evacuating means 31. A driving means 71 such as a pneumatic cylinder is arranged at the bottom of the preparatory chamber 3 and a supporting disc 73 is mounted on the tip end of a shaft 72 of the driving means 71 projected into the preparatory chamber 3. The driving means 71 and the supporting disc 73 form a conveying means 7 and the supporting disc 73 can be moved upward and downward between a predetermined position (elevated position) within the process chamber 2 and a predetermined position (lowered position) within the preparatory chamber 3.

A pusher member 74 having an inverted "T" shaped cross-section is mounted on the shaft 72 below the supporting disc 73. When the conveying means 7 is moved to the elevated position, the pusher member 74 pushes the disc 63 upward and thus forces a sealing member (not shown) such as a metal seal arranged at outer periphery of the disc 63 against the periphery of the opening formed in top plate 41 to tightly close the process chamber 2. The pusher member 74 is provided with a third heating means (not shown).

The second space 3a forming the preparatory chamber 3 is provided with a plasma generating means comprising a coil (not shown) connected to a high frequency power source and a gas introducing means 32 for introducing inert gas into the preparatory chamber 3. The inert gas includes e.g. rare gas such as He and Ar etc. A pretreatment of cleaning the surface of article S using plasma is carried out within the preparatory chamber 3 prior to the coating carried out within the process chamber 2 with generating plasma within the preparatory chamber 3. In this case, it is possible to carry out a pretreatment of cleaning the surface of article S using heat treatment for example by providing an electric heater (not shown) of W within the preparatory chamber 3 and further carry out heat treatment of the article S completed the coating within a vacuum atmosphere.

Figure 3:
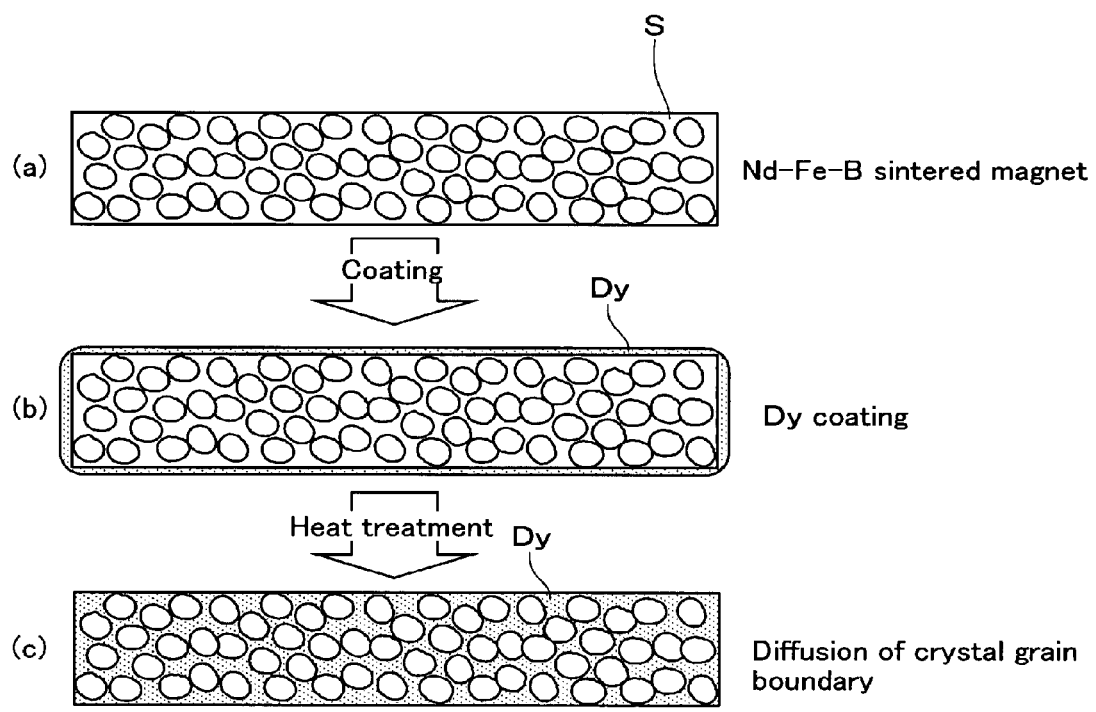
FIG. 3 is an explanatory view showing steps of manufacture of a permanent magnet of the present invention.

Then manufacture of the permanent magnet of the present invention with carrying out the present method using the present apparatus 1 will be described with reference to FIGS. 1-3. First of all, a sintered magnet of Fe—B-rare earth elements being an article to be coated is manufactured using any known method. For example, the sintered magnet can be manufactured by high frequency melting blend of Fe, B and Nd of a predetermined composition ratio and casting it to have an ingot, then by grinding the ingot to powder and molding the magnetically oriented powder to a predetermined configuration, and finally by sintering the molded article to obtain a sintered magnet S (FIG. 3(a)). Then the sintered magnets S of a predetermined configuration are placed on the supporting members 62 of the supporting means 6. In this case, it is preferable to arrange the sintered magnets S on the supporting members 62 so that the direction of easy magnetization of the sintered magnets S corresponds to a direction parallel to the supporting members 62.

Then the vaporizable metallic material Dy is arranged on the acceptor 24 within the process chamber 2. The grain diameter of Dy is preferably in a range of 10~1,000 μm. This is because that handling of grains of Dy and Tb having inflammability is difficult at a grain diameter smaller than 10 μm and on the other hand a longer time duration for vaporization is required at a grain diameter larger than 1,000 μm. For increasing the yield of Dy, gross of Dy placed on the acceptor 24 is determined as an amount required to hold the Dy vapor atmosphere within the process chamber 2 until the magnet reaches a predetermined temperature (temperature at which the vaporizable metallic material diffuses not only into the crystal grain but into the crystal grain boundary).

Then the gate valve arranged on the side wall 30 is opened to introduce the supporting means 6 supporting the sintered magnets S into the second space 3a and the supporting means 6 is laid on the disc 63. Then the gate valve is closed and evacuating means 11a and 31 are actuated to evacuate the vacuum chamber 11 as well as the preparatory chamber 3 and the process chamber 2 via the first space 4 until they reach a predetermined pressure (e.g. $10 \times 10^{-6}$ Pa). In this case, the open/close means 5 is in the opened position.

Then, when the pressure in the process chamber 2 and the preparatory chamber 3 reach a predetermined value, the open/close means 5 is moved to the closed position by the driving means 52 so that the valve body 51 closes the process chamber 2. Then the heating means 23 and the second heating means of the valve body 51 of the open/close means 5 are actuated to heat the process chamber 2 until the temperature within the process chamber 2 reaches a predetermined temperature. The temperature within the process chamber is preferably set in a range of 1,000~1,700° C. This is because that a vapor pressure which can coat Dy at a high speed on the surface of magnet S cannot be obtained at a temperature lower than 1,000° C. and on the other hand the coating time duration of the sintered magnet S becomes too short to obtain a uniform coating at a temperature higher than 1,700° C. The temperature within the process chamber 2 is preferably in a range 1,200~1,500° C., and more preferably in a range 1,200~1,400° C. A desirable coating thickness can be obtained at a high speed in these temperature ranges.

Then generating Dy vapor atmosphere having a vapor pressure e.g. of 10 Pa at 1,300° C. in the process chamber 2. Since convection is caused within the process chamber 2 under a vapor pressure of 10 Pa, coating is formed on a whole surface of the sintered magnet S of ordinary temperature when it is introduced into the process chamber.

When the uniformly heating plate 21 defining the process chamber 2 is formed of $Al_2O_3$ widely used in a general vacuum apparatus, it is afraid that Dy in vapor atmosphere reacts with $Al_2O_3$ and forms reaction products on its surface and Al atoms would enter into the Dy vapor atmosphere. For such a reason, the uniformly heating plate 21 defining the process chamber 2, the supporting means 6 for supporting the sintered magnets S and the supporting disc 73 of the conveying means 7 is formed of materials which do not react with vaporizable metallic materials used for coating, for example, Mo, W, V, Ta, alloys of these elements, CaO, $Y_2O_3$, or oxides of rare earth elements. In addition, coating formed of these materials may be applied to a surface of heat insulating member as a lining film.

While Dy vapor atmosphere is formed within the process chamber 2, a pretreatment of surface cleaning is carried out within the preparatory chamber 3, for example, for removing an oxide film on the sintered magnet S therefrom. In this case, it may be possible carry out the cleaning of surface of the sintered magnet by plasma generated within the preparatory chamber 3 by introducing inert gas e.g. Ar into the preparatory chamber 3 via the gas introducing means 32 and then by actuating the high frequency power source until the pressure within the preparatory chamber 3 reaches a predetermined value (e.g. $10\times10^{-1}$ Pa). When the pretreatment is completed, the temperature of the sintered material will be from the room temperature to 200° C.

When the formation of Dy vapor atmosphere within the process chamber 2 and the cleaning of the surface of sintered magnet S are completed, inert gas e.g. Ar is introduced into the preparatory chamber 3 via the gas introducing means 32 until the pressure within the preparatory chamber 3 reaches a predetermined value (e.g. 1,000 Pa) so as to once generate a pressure difference more than two digits relative to the process chamber 2. When the pressure within the preparatory chamber 3 has reached a predetermined value, the process chamber 2 and the preparatory chamber 3 are communicated with each other by displacing the open/close means 5 to its opened position. In this case, since the pressure within the process chamber 2 is differentiated from that in the preparatory chamber 3, Ar is flowed into the process chamber 2 from the preparatory chamber 3 and as the pressure within the process chamber 2 is increased. Thus, although the vaporization is once stopped (however operation of the heating means 23 is not stopped), entering of Dy vaporized within the process chamber 2 into the preparatory chamber 3 is prevented.

Then, when the pressure within the process chamber 2 and the preparatory chamber 3 is evacuated again via the evacuating means 31 until it reaches a predetermined value (e.g. $10\times10^{-2}$ Pa), Dy is vaporized again. Then the supporting means 6 supporting sintered magnets S is conveyed into the process chamber 2 with actuation of driving means 71 of the conveying means 7. In this case the process chamber 2 is tightly closed with a sealing member such as a metal seal provided on the periphery of the disc 63 being closely contacted against a surface around the opening formed in the top plate 41.

Then, when the process chamber 2 being heated is tightly closed again, e.g. Dy saturated vapor atmosphere of 10 Pa at 1,300° C. is generated within the process chamber 2 and this condition is held for a predetermined time duration. In this case, since sintered magnets S having a temperature lower than that within the process chamber 2 have been introduced into the process chamber 2, Dy in the vapor is selectively deposited on the surface of the sintered magnets S due to the temperature difference between the temperature within the process chamber 2 and that of the magnets S (coating step). Thus Dy can be coated at a high speed only on the surface of the sintered magnets S (FIG. 3(b)). During which, no Dy is deposited on the pusher member 74 of the supporting table 73 since the pusher member 74 is heated to a temperature substantially same as that of the uniformly heating plate 21 by a third heating means (not shown).

Since not only Dy but the sintered magnets S themselves are heated by radiant heat when sintered magnets S having the ordinary temperature are introduced into the process chamber 2 heated to a high temperature, the holding time duration within the process chamber 2 in which saturated vapor atmosphere is generated is a term by the sintered magnets S reach 900° C. and also a term by a necessary amount of Dy is deposited on the surface of the sintered magnets S (in which "necessary amount of Dy" means an amount that Dy is diffused only into the crystal grain boundary to improve the magnetic properties of the sintered magnets 5). If the sintered magnets S are heated to a temperature exceeding 900° C., Dy would be diffused into grains (crystal grains of the principal phase) of the magnets S. Eventually such a situation would be same as that of admixture of Dy during manufacturing of the permanent magnet and thus it is afraid that the magnetic field strength therefore the maximum energy product exhibiting the magnetic properties would be greatly reduced.

By the way, when the sintered magnet S is thermally expanded due to heating, the thermal expansion of the sintered magnet S exhibits abnormality like an invar alloy at a temperature lower than the Curie temperature (about 300° C.) and thus peeling of the coating deposited on the surface of magnet S is liable to be caused. Accordingly the holding time duration is preferably so that the maximum temperature of the sintered magnet S is lower than 250° C. or higher than 450° C. This is because that the peeling of the coating deposited on the surface of magnet is hard to be caused since strain due to thermal expanding abnormality is reduced at a temperature lower than 250° C. and on the other hand, adhesion between the magnet and Dy deposited on the surface of magnet is improved due to melting of part of the magnet and thus the peeling of the coating deposited on the surface of magnet is hard to be caused at a temperature higher than 450° C.

On the other hand, an inert gas such as Ar is introduced into the preparatory chamber 3 via the gas introducing means 32 until the pressure within the preparatory chamber 3 reaches a predetermined value (e.g. 1,000 Pa). After a lapse of predetermined time duration after conveyance of the sintered magnets S into the process chamber 2, the supporting disc 73 is moved from the elevated position within the process chamber 2 to the lowered position within the preparatory chamber 3 and the open/close means 5 is moved from the opened position to the closed position. During which, no Dy in the vapor is deposited on the valve body 51 of the open/close means 5 since the valve body 51 is heated by the second heating means (not shown) to a temperature substantially same as that of the uniformly heating plate 21. The vaporization is stopped due to a fact that Ar enters from the preparatory chamber 3 to the process chamber 2 and the sintered magnets S on which Dy is coated are cooled in the Ar atmosphere.

Then the preparatory chamber 3 isolated from the process chamber 2 is evacuated by the evacuating means 31 until the pressure within the preparatory chamber 3 reaches a predetermined value ($10\times10^{-3}$ Pa), and heat treatment is carried out on the sintered magnets S on which Dy having been coated for a predetermined time duration under a predetermined temperature (e.g. 700~950° C.) with actuation of the heating means arranged in the preparatory chamber 3 (diffusing step). In this case, it is preferable, continuously with the heat treatment within the preparatory chamber 3, to carry out heat treatment for removing strain of permanent magnets for a predetermined time duration (e.g. 30 minutes) under a predetermined temperature (e.g. 500~600° C.) lower than that in said heat treatment (annealing step). Finally the supporting means 6 is taken out from the preparatory chamber 3 by opening the gate valve on the side wall 30 after having cooled for a predetermined time duration.

Thus it is possible to obtain permanent magnets on which Dy is coated over a whole surface of the sintered magnets S and heat treatment is carried out to uniformly diffuse Dy coated on the surface of the magnets S into crystal grain boundary phases of the magnets (FIG. 3(c)). The neodymium magnet of the prior art has nature of being easily corroded and thus its surface is covered by a protecting coating of resin such as epoxy or PPS or surface treatment such as nickel plating. On the contrary, the surface of the magnet of the present invention is covered by a coating of Dy having extremely higher corrosion and weather resistance than those of Nd and thus it is possible to obtain a permanent magnet having excellent corrosion and weather resistance without requiring any additional protecting film. Accordingly owing to omission of the additional surface treating steps, it is possible to coat Dy on surfaces of magnets at a high speed and at a predetermined coating thickness as well as to further improve the productivity and to reduce the manufacturing cost.

It is preferable that the surface and crystal grain boundary of the magnet have a Dy rich phase (phase including 5~80% Dy). The neodymium magnet of the prior art has three phases comprising the principal phase, Nd rich phase and B rich phase. According to the present invention since Dy rich phase is present in the Nd rich phase in the crystal grain boundary which is weak in the corrosion resistance and weather resistance, it is possible to manufacture permanent magnets having extremely strong corrosion resistance and weather corrosion conjointly the fact that Dy rich phase is present on the surface of the sintered magnets S.

It is more preferable that the surface of sintered magnets S is covered by the Dy rich phase and the crystal grain boundary includes the Dy rich phase of 1~50%. On the other hand, when the crystal grain boundary includes the Dy rich phase more than 50%, the maximum energy product, remanent magnetic flux density and coercive force exhibiting the magnetic properties are extremely reduced.

Although the present invention has been described as to carrying out coating of Dy on a surface of sintered magnets S of Fe—B-rare earth elements, the coating method and apparatus 1 of the present invention is not limited to such an embodiment and can be applied to coating of other vaporizable metallic materials. In this case, conditions such as the heating temperature within the process chamber 2 and holding time duration etc. are suitably set in accordance with articles to be coated and properties of the vaporizable metallic materials. In addition, it is possible to use Tb in place of Dy and to coat Tb at a high speed and selectively on the surface of sintered magnets of Fe—B-rare metal elements using the coating method and apparatus of the present invention. Furthermore, it is possible to carry out the diffusion step within the process chamber 2 after the coating has been completed.

In addition, it is possible to use as vaporizable metallic material to be coated an alloy including at least one of Dy and Tb and at least one of Nd, Pr, Al, Cu, Ga and Ta for increasing the coercive force. Such an alloy can further increase especially the coercive force as compared with permanent magnets obtained with being carried out the heat treatment. In this case, since Dy and Tb have a high melting point, it is preferable to use materials having a lower melting point than them to generate vaporizable metallic material at a shorter time duration.

Figure 4:
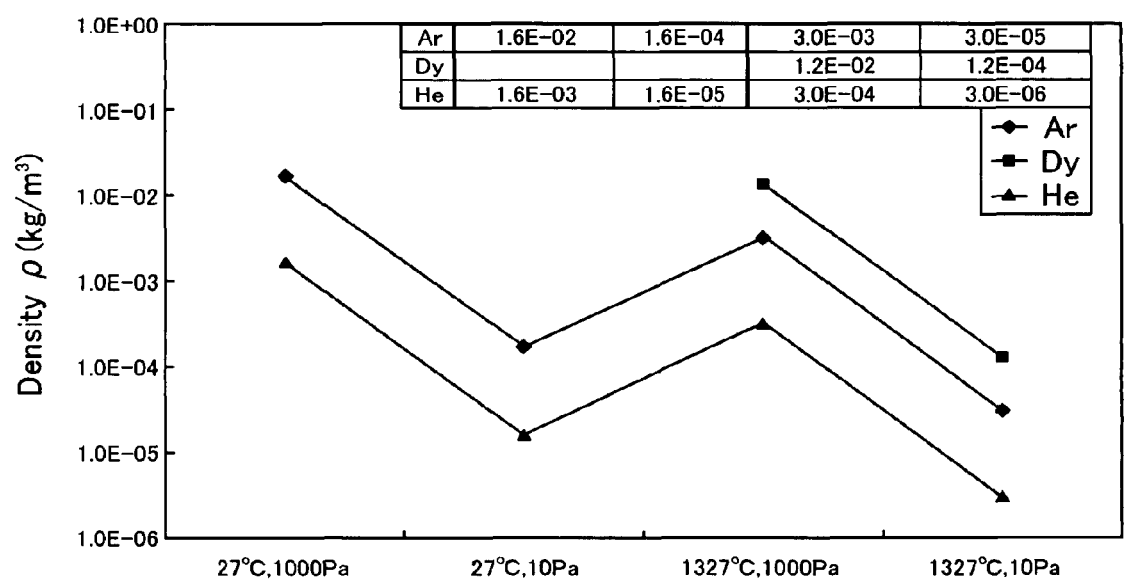
FIG. 4 is a graph showing a relation between the temperature and the density of Ar, He and Dy.

Although the preparatory chamber 3 is arranged under the process chamber 2 in the illustrated embodiment, it is possible to arrange the process chamber 2 under the preparatory chamber 3. As shown in FIG. 4, when measuring the density of Ar, He and Dy relative to a constant pressure and temperature, the density of Dy and Ar under a constant pressure is analogous for example in cases of Ar density under a pressure of 10 Pa and a room temperature (about 27° C.) and Dy density under a pressure of 10 Pa and a high temperature (about 1,300° C.). From this fact, it is possible to securely prevent a leakage of Dy vapor from the process chamber 2 to the preparatory chamber 3 due to a difference in specific gravity while the sintered magnets S are taken out from the process chamber 2, by introducing He gas having a large difference in density relative to a constant pressure into the preparatory 3 so that the pressure in the process chamber 2 and that in the preparatory chamber 3 are substantially same when the process chamber 2 is arranged under the preparatory chamber 3.

Although it is structured in the illustrated embodiment that heat is hard to be transmitted to the sintered magnets S through the posts 61, the present invention is not limited to such a structure and it may be possible to provide any cooling means to forcedly suppress temperature rise of the sintered magnets S. In this case, it is possible to provide a cooling means to suppress temperature rise of the sintered magnets S heated by radiant heat when the magnets S of ordinary temperature are introduced into the process chamber 3 heated to a high temperature by circulating a coolant (cooling water) through the posts 61 with enlarging a diameter of each post 61.

Embodiment 1

Each sintered magnet of Fe—B-rare earth elements was made as a rectangular parallelopiped of 50×50×8 mm using a raw material having a composition of 31Nd-1Co-1B-0.1Cu-bal.Fe ("NEOMAX-50 manufactured by NEOMAX Co.). The surface of sintered magnet S was cleaned using acetone after having finished it as having a surface roughness of less than 20 μm.

Dy was coated on the surface of sintered magnet S using the coating apparatus 1 and method of the present invention. Dy of 99.9% degree of purity was used as the coating material and Dy of gross 500 g was laid on the receptor 24. A wire forming the mesh type supporting member 62 of the supporting means 6 is made of Mo and has a diameter of 1 mm. Then four (4) cleaned sintered magnets S were laid on each supporting members 62 on a circle of a diameter (80 mm) oppositely in a diametrical direction each other (totally eight (8) sintered magnets S were placed on two supporting members 62 of upper and lower stages. A space between the supporting members 62 of the upper and lower stages is 60 mm.

Prior to coating of Dy, Ar was introduced into the preparatory chamber 3 and cleaning by plasma treatment of the surface of sintered magnet S was carried out for 60 seconds under conditions of a pressure of $10 \times 10^{-1}$ Pa and of a high frequency voltage of 800 V. The temperature of the sintered magnet S after this cleaning was 60° C.

On the other hand, the process chamber 2 was closed by the open/close means 5 at its closed position and heated to 1,350° C. to vaporize Dy and to fill the process chamber 2 with Dy vapor. The pressure within the process chamber 2 and the preparatory chamber 3 when introducing the sintered magnets S into the Dy vapor atmosphere was set at $10 \times 10^{-2}$ Pa and the holding time duration after the sintered magnets S having been introduced into the process chamber 2 was set at 40 seconds. Furthermore, as conditions of heat treatment within the preparatory chamber 3, the pressure within the preparatory chamber 3 was set at $10 \times 10^{-3}$ Pa and the holding time duration was set at 5 minutes at 800° C. and 30 minutes at 600° C.

FIG. 5 is a table showing average values of magnetic properties of eight (8) permanent magnets manufactured under conditions described above. Magnetic properties of magnets on which Dy is not coated are also shown in the table of FIG. 5 as comparative examples. From these results, it is found that permanent magnets were obtained having a high magnetic properties such as the maximum energy product of 50.3 MGOe, the remanent magnetic flux density of 14.4 kG and the coercive force of 23.5 KOe. The temperature of the sintered magnet S after being held for 40 seconds was about 600° C. and the coating thickness was about 100 μm and the coating was formed substantially uniformly on the surface of sintered magnet S.

Embodiment 2

In this embodiment 2, permanent magnets were manufactured at same conditions as those in the embodiment 1 except for that heat treatment was not carried out. However, the holding time duration of the permanent magnets within the Dy vapor atmosphere was set at one (1) minute and the temperature within the process chamber was varied. FIG. 6 is a table showing average values of a coating thickness of Dy when the coating was carried out under these conditions, and the magnetic properties of permanent magnets manufactured in this embodiment. According to this embodiment 2, it can be found that little coating is formed at a temperature lower than 1,000° C., but coating can be formed at a high speed more than 20 μm/sec at a temperature higher than 1,200° C. In this case, it is found that it is possible to obtain a permanent magnet having a maximum energy product of about 50 MG0e of little loss and a high coercive force of 17 K0e or more in a range of 1,100~1,700° C.

Embodiment 3

In this embodiment 3, permanent magnets were manufactured at same conditions as those in the embodiment 1 except for that pretreatment (cleaning treatment) was not carried out. However, the holding time duration of the permanent magnets within the Dy vapor atmosphere was varied. FIG. 7 is a table showing average values of the coating thickness of Dy coated with the holding time duration being varied, the maximum and the magnetic properties of permanent magnets manufactured in this embodiment. According to this embodiment 3, it can be found that a vapor depositing velocity exceeding 17 μm can be obtained and the temperature rise of sintered magnet itself is at most 743° C. although it is held for 60 seconds. In this case, it is found that it is possible to obtain a permanent magnet of high coercive force having a maximum energy product of about 50 MG0e, a remanent magnetic flux density of 14.5 kG and a coercive force of 15.4~21.3 K0e.

Embodiment 4

In this embodiment 4, permanent magnets were manufactured at same conditions as those in the embodiment 1 except for that pretreatment (cleaning treatment) was not carried out. However, the wire for forming the mesh type supporting member 62 of the supporting means 6 is made of Mo and has a diameter of 3 mm. FIG. 8 is a table showing the magnetic properties when such a wire of Mo and having a diameter of 3 mm is used for making the supporting member 62. According to this embodiment 4, it can be found that although there are remained mesh shaped non-coated portions on the surface of the sintered magnet S facing to the supporting member 62 with using a thick wire, there is scarcely influenced on the coating of the magnet S by carrying out the coating operation on the mesh type supporting member 62 with laying the magnet S on the supporting member 62 in view of the direction of easy magnetization and thus it is possible to obtain a permanent magnet of high coercive force having a maximum energy product of 50.0 MG0e, the remanent magnetic flux density of 14.4 kG and the coercive force of 21.3 K0e.

Embodiment 5

Figure 9:
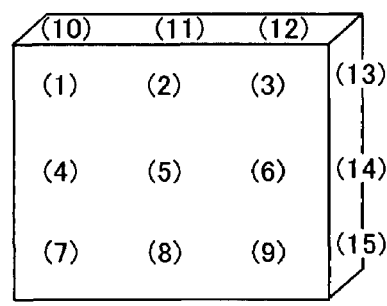
FIG. 9 is a table showing average values of coating thickness on the surface of a magnet coated in an embodiment 5.

In this embodiment 5, permanent magnets were manufactured at same conditions as those in the embodiment 1 however the holding time duration of the sintered magnet within the Dy vapor atmosphere was varied. FIG. 9(a) is a table showing average values of variation of the coating thickness of Dy at measuring points shown in FIG. 9(b) (measuring points (1)~(15)). According to this table of FIG. 9(a), it is found that substantially uniform coating can be obtained.

Embodiment 6

In this embodiment 6, each sintered magnet of Fe—B-rare earth elements was made as a rectangular parallelopiped of 3×50×40 mm using a raw material having a composition of 22Nd-5Dy-0.9B-4Co-bal.Fe. In this case, a surface of the sintered magnet S was finished as having the surface roughness less than 50 μm.

Then a metallic coating was formed on a surface of the sintered magnet S by using the coating apparatus 1 and method of the present invention. Raw material having a composition of 10Dy-5Tb-50Nd-35Pr was used as coating material and laid on the receptor 24. A wire forming the mesh type supporting member 62 of the supporting means 6 is made of Mo and has a diameter of 1 mm. One hundred (100) sintered magnets S cleaned as mentioned above were arranged so that they were diametrically opposed on the supporting member 62.

On the other hand, the process chamber 2 was tightly closed at the closed position of the open/close means 5 and heated to 1,250° C. to vaporize the vaporizable coating material having a composition mentioned above to generate metallic vapor atmosphere within the process chamber 2. The pressure within the process chamber 2 and the preparatory chamber 3 when the sintered magnets S are introduced into the metallic vapor atmosphere was set at $10\times10^{-2}$ Pa and the pressure within the preparatory chamber 3 was set at substantially same as that within the process chamber 2 by introducing He gas into the preparatory chamber 3.

The holding time duration after the sintered magnets S having been conveyed into the process chamber 2 was set at 10~300 seconds so that the maximum temperature of each sintered magnet became 100~1,000° C. In this case, each post 61 was water cooled. In addition, as conditions of the heat treatment within the preparatory chamber 3, the pressure within the preparatory chamber 3 was set at $10\times10^{-3}$ Pa and the holding time duration was one (1) hour at 800° C. (diffusing step) and 30 minutes at 600° C. (annealing step). Then the pressure within the preparatory chamber 3 was returned to the atmosphere pressure and the magnets were taken out therefrom.

FIG. 10 is a table showing the magnetic properties as to one hundred (100) permanent magnets manufactured under conditions mentioned above and the fraction deflection of adhesion after having carried out the tape peeling method (tape test). According to these results, it is found that when the maximum temperature of the sintered magnets S does not reach 100° C., the coating material does not deposit on the surface of the sintered magnets S and thus a high coercive force cannot be obtained. On the other hand, it is found that when the maximum temperature is in a range of 100~1,050° C., the coating material of a thickness of 10 μm or more is deposited on the surface of the sintered magnet S and a permanent magnet of high coercive force having the maximum energy product of 44 MG0e or more, the remanent magnetic flux density of 13.8 kG or more and the coercive force of 28 K0e or more is obtainable. However it is also found that when the temperature of the sintered magnet S is in a range of 250~450° C., the percent defective of adhesion of less than 10% was caused. In the embodiment 6, since cleaning of a surface of the sintered magnets is not carried out prior to Dy coating, ingress of Dy into grains of the sintered magnet during coating operation is suppressed and thus it is found that the maximum energy product exhibiting the magnetic properties is not reduced although the maximum temperature of the sintered magnets exceed 900° C.

Embodiment 7

In this embodiment 7, each sintered magnet of Fe—B-rare earth elements was made as a rectangular parallelopiped of 5×50×40 mm using a raw material having a composition of 28Nd-1B-0.05Cu-0.17Zr-bal.Fe. In this case, a surface of the sintered magnet S was finished as having the surface roughness less than 5 μm and then cleaned by using acetone.

Then Dy was coated on a surface of the sintered magnet S by using the coating apparatus 1 and method of the present invention. In this case Dy of 99.9% degree of purity was used as coating material and laid on the receptor 24. One hundred (100) sintered magnets S cleaned as mentioned above were arranged so that they were diametrically opposed on the supporting member 62.

Prior to coating operation, Ar was introduced into the preparatory chamber 3 and cleaning by plasma treatment of the surface of sintered magnet S was carried out for 60 seconds under conditions of a pressure of $10 \times 10^{-1}$ Pa and of a high frequency voltage of 800 V. The temperature of the sintered magnet S after this cleaning was 60° C.

On the other hand, the process chamber 2 was closed by the open/close means 5 at its closed position and heated to 1,200° C. to vaporize Dy and to generate metallic vapor atmosphere within the process chamber 2. The pressure within the process chamber 2 and the preparatory chamber 3 when introducing the sintered magnets S into the Dy vapor atmosphere was set at $10 \times 10^{-2}$ Pa and the holding time duration was set so that Dy coating of 20 μm in average can be formed after the sintered magnets S having been introduced into the process chamber 2. Furthermore, as conditions of heat treatment within the preparatory chamber 3, the pressure within the preparatory chamber 3 was set at $10 \times 10^{-3}$ Pa and the holding time duration was set at one (1) hour at 950° C. (diffusion step) and 30 minutes at 500° C. (annealing step). Then the pressure within the preparatory chamber 3 was returned to the atmosphere pressure and the magnets were taken out therefrom.

Comparative Examples

Sintered magnets S were manufactured under same conditions as those in the embodiment 7 as comparative examples 1-3. In the comparative example 1, permanent magnets were obtained by applying resin coating of epoxy of 20 μm in average on the surface of one hundred (100) sintered magnets S using a known method in place of forming Dy coating and heat treatment on the surface of magnets S. In the comparative example 2, Ni plating of 20 μm in average was applied on the surface of one hundred (100) sintered magnets S using a known plating method. In the comparative example 3, Al of 20 μm coating thickness in average was vapor deposited on the surface of one hundred (100) sintered magnets S using a known vapor depositing method.

FIG. 11 is a table showing results of comparison between permanent magnets of the embodiment 7 and comparative examples 1~3, and the sintered magnets S (comparative example 4) respectively as to the magnetic properties, corrosion resistance test and weather resistance. Following corrosion resistance test and the weather resistance test were carried out: a visual inspection test confirming if or not generation of corrosion after a lapse of 100 hours from spraying of saline water on the surfaces of permanent magnets and sintered magnets; a saturated steam pressure test (PCT: pressure cooker test) for 100 hour; and a visual inspection test confirming if or not generation of corrosion after a lapse of 1,000 hour under a condition of temperature of 80° C. and humidity of 90%.

According to this comparison, it is found that the permanent magnet of the embodiment 7 of the present invention has high magnetic properties of the maximum energy product of 56 MGOe, the remanent magnetic flux density of 15.0 kG or more, and the coercive force of 28 KOe relative to the coercive force of 10 KOe in the comparative examples 1~4. In addition, it is also found that although generation of corrosion was confirmed in the corrosion resistance test or weather resistance test as to the comparative examples 1~4, no generation of corrosion is confirmed in these test as to the embodiment 7 of the present invention and thus the permanent magnets manufactured in accordance with the present invention have strong corrosion resistance and weather resistance.

Embodiment 8

In this embodiment 8, each sintered magnet of Fe—B-rare earth elements was made as a rectangular parallelopiped of 50×50×8 mm using a raw material having a composition of 31Nd-1Co-1B-0.1Cu-bal.Fe ("NEOMAX-50 manufactured by NEOMAX Co.). The surface of sintered magnet S was cleaned using acetone after having finished it as having a surface roughness of less than 20 μm.

Vaporizable metallic material was coated on the surface of sintered magnet S using the coating apparatus 1 and method of the present invention. Alloy comprising Dy and Nd, Pr, Al, Cu, Ga, Ta mingled with Dy respectively at stoichimetric ratio 1:1 was used as the vaporizable metallic material and laid on the receptor 24. Prior to coating of the vaporizable metallic material, Ar was introduced into the preparatory chamber 3 and cleaning by plasma treatment of the surface of sintered magnet S was carried out for 60 seconds under conditions of a pressure of $10 \times 10^{-1}$ Pa and of high frequency voltage of 800 V. The temperature of the sintered magnet S after this cleaning was 60° C.

On the other hand, the process chamber 2 was closed by the open/close means 5 at its closed position and heated to 1,350° C. to vaporize the vaporizable metallic material and to fill the process chamber 2 with metallic vapor. The pressure within the process chamber 2 and the preparatory chamber 3 when introducing the sintered magnets S into the metallic vapor atmosphere was set at $10 \times 10^{-2}$ Pa and the holding time duration was set so that a coating having a coating thickness of about 30 μm was formed after the sintered magnets S having been introduced into the process chamber 2. Furthermore as conditions of heat treatment within the preparatory chamber 3, the pressure within the preparatory chamber 3 was set at $10 \times 10^{-3}$ Pa and the holding time duration was set at 5 minutes at 800° C. (diffusing step) and 30 minutes at 600° C. (annealing step).

FIG. 12 is a table showing the magnetic properties of permanent magnets manufactured under conditions described above. Magnetic properties as to magnets in which only Dy was used as vaporizable metallic material and as to magnets in which alloy comprising Dy and Ni, Co, Fe, Au, Pt, Ag mingled with Dy respectively at stoichimetric ratio 1:1 was used as the vaporizable metallic material are also shown in the table. From these results, it is found that permanent magnets of comparative examples are substantially reduced especially in the coercive force and the maximum energy product as compared with the permanent magnets comprising coating of only Dy. On the other hand, it is found that the permanent magnets of the embodiment 8 of the present invention is superior especially in the coercive force as compared with the magnets comprising coating of only Dy and that it is possible to obtain permanent magnets having high magnetic properties of the maximum energy product ((BH)max) of 50.6 MG0e or more, the remanent magnetic flux density (Br) of 14.0 kG or more, and the coercive force (Hcj) of 24.1 K0e or more.

The present invention has been described with reference to the preferred embodiment. Obviously, modifications and alternations will occur to those of ordinary skill in the art upon reading and understanding the preceding detailed description. It is intended that the present invention be construed as including all such alternations and modifications insofar as they come within the scope of the appended claims or the equivalents thereof.

What is claimed is:

1. A method for manufacturing a permanent magnet, the method comprising the steps of:
   coating a vaporizable metallic material including at least one of Dy and Tb onto a surface of a magnet of Fe—B-rare earth elements having a predetermined configuration; and
   diffusing the vaporizable metallic material coated onto the surface of the magnet into crystal grain boundary phases of the magnet by heat treating the vaporizable metallic material at a first predetermined temperature,
   wherein the coating step comprises:
      a first step for heating a process chamber to the first predetermined temperature used for carrying out the coating step and generating metallic vapor atmosphere within the process chamber by vaporizing the vaporizable metallic material previously arranged within the process chamber; and
      a second step for introducing into the process chamber the magnet held at a second predetermined temperature that is lower than the first predetermined temperature within the process chamber and selectively depositing the vaporizable metallic material onto the surface of the magnet by an effect of a temperature difference between the first predetermined temperature within the process chamber and the second predetermined temperature of the magnet until the magnet heats up and reaches a third predetermined temperature.

2. The method of claim 1, wherein the metallic vapor atmosphere is in a saturated condition within the process chamber.

3. The method of claim 1, wherein the vaporizable metallic material further includes at least one of Nd, Pr, Al, Cu, Ga and Ta.

4. The method of claim 1, wherein the third predetermined temperature in the second step is lower than 250° C. or higher than 450° C.

5. The method of claim 1, further comprising cleaning the surface of the magnet within a vacuum atmosphere prior to introduction of the magnet into the process chamber such that the magnet is held at the second predetermined temperature, which is lower than the first predetermined temperature within the process chamber.

6. The method of claim 1, wherein the first predetermined temperature within the process chamber in the first step is set at a range of 1,000~1,700° C.

7. The method of claim 1, wherein a grain diameter of the vaporizable metallic material prior to the vaporizing the vaporizable metallic material is in a range of 10~1,000 μm.

8. The method of claim 1, wherein the second step is performed subsequent to the first step.

* * * * *